United States Patent
Chakravarthy et al.

(10) Patent No.: US 8,190,953 B2
(45) Date of Patent: May 29, 2012

(54) METHOD AND SYSTEM FOR SELECTING TEST VECTORS IN STATISTICAL VOLUME DIAGNOSIS USING FAILED TEST DATA

(76) Inventors: Sameer H. Chakravarthy, Noida (IN); Ratan Deep H. Singh, Chennai (IN); Thomas Webster Bartenstein, Owego, NY (US); Joseph Michael Swenton, Owego, NY (US); Shaleen Bhabu, New Delhi (IN)

( * ) Notice: Subject to any disclaimer, the term of this patent is extended or adjusted under 35 U.S.C. 154(b) by 525 days.

(21) Appl. No.: 12/245,174

(22) Filed: Oct. 3, 2008

(65) Prior Publication Data
US 2010/0088560 A1 Apr. 8, 2010

(51) Int. Cl.
*G01R 31/3183* (2006.01)
*G01R 31/40* (2006.01)

(52) U.S. Cl. ........................................ 714/726; 714/738
(58) Field of Classification Search .................. None
See application file for complete search history.

(56) References Cited

U.S. PATENT DOCUMENTS

| | | | |
|---|---|---|---|
| 3,784,910 A * | 1/1974 | Sylvan | 324/500 |
| 6,198,274 B1 * | 3/2001 | Onishi | 324/750.18 |
| 6,694,495 B1 * | 2/2004 | Hussain et al. | 716/109 |
| 6,721,914 B2 * | 4/2004 | Bartenstein et al. | 714/734 |
| 7,739,065 B1 * | 6/2010 | Lee et al. | 702/83 |
| 2007/0226570 A1 * | 9/2007 | Zou et al. | 714/741 |

FOREIGN PATENT DOCUMENTS

JP 2008192227 A * 8/2008

* cited by examiner

*Primary Examiner* — Jeffrey A Gaffin
*Assistant Examiner* — Dipakkumar Gandhi
(74) *Attorney, Agent, or Firm* — Dickstein Shapiro LLP

(57) ABSTRACT

A method and system for test vector selection in statistical volume diagnosis using failed test data is disclosed. A computer-implemented method receives failures representing defects detected by an integrated circuit testing apparatus from a plurality of integrated circuits. Each of the plurality of integrated circuits is tested with a set of test vectors generated by the integrated circuit testing apparatus, and each of the plurality of failures is associated with a failed test vector. Using a first ranking scheme, each of the failures is given a rank and the corresponding failed test vector in each of the plurality of integrated circuits is annotated with the rank. The annotated failed test vectors are grouped using a grouping scheme, and each of the groups is given a group rank. A first group of failed test vectors is selected based on the group rank and diagnostics is run on the first group of failed test vectors.

30 Claims, 5 Drawing Sheets

METHOD AND SYSTEM FOR SELECTING TEST VECTORS IN STATISTICAL VOLUME DIAGNOSIS USING FAILED TEST DATA

FIELD

The field of the invention relates generally to hardware and software verification of logic circuits and more particularly relates to a method and system for selecting test vectors in volume diagnostics using failed test data from Automatic test equipment (ATE).

BACKGROUND

After being fabricated, Integrated Circuits (ICs) are tested for proper functional operation using a set of test vectors that contain test inputs and the expected test outputs. Test vectors generated by an Automatic Test Pattern Generation (ATPG) software are applied to the chip or device under test (DUT) by an Automatic Test Equipment (ATE). The ICs that successfully passed all the test vectors are qualified as good whereas the ICs that failed on any of the test vectors are qualified as bad or defective. For the defective ICs, the failure information is collected by the ATE and stored in a buffer for further processing using diagnostics tools.

Defects of a defective chip are located using the failure information obtained from the ATE and the test vectors applied to the defective chip as well as the design information with which the chip is fabricated. Diagnostics tools are used to identify failed patterns by fault selection and perform fault simulation on the failed patterns to identify the location of the defects that best matches the failures observed by the ATE. The matching is typically done using a scoring formula that takes the number of predictions, mis-predictions and non-predictions into account. The diagnostics tools are generally useful in identifying yield limiters and possibly locating them on the defective IC to help chip designers to find the weaknesses in their designs and to improve them by fixing the cause of such failures.

Identifying the location of defects using diagnostics tools becomes more challenging because of the ever increasing complexity of chip design and manufacturing processes as well as the shrinking size of circuits formed on semiconductor chips. In particular, many yield problems associated with nanometer processes are caused by systematic design-process interactions. Recent developments in process technology and complexity in semiconductor chip design outpaced the developments in physical analysis and verification tools, resulting in yield losses caused by systematic defects. In order to accelerate yield ramp, a methodology called volume yield diagnostics (VYD) is used in the diagnostics tools to identify the most critical yield issues related to design processes.

Conventional VYD restricts the amount of time it takes to find the locations of systematic defects. A new diagnostic method proposed by Hora, et al. ("An Effective Diagnosis Method to Support Yield Improvement", International test Conference, pp. 260-269, 2002) produces a finite list of suspect locations to keep the analysis time low. Hora et al. teach a method, so called Statistical Volume Diagnosis (SVD), incorporating several adjustments over conventional yield diagnostic methods. For example, only a subset of failures observed by the tester is chosen for analysis. In general, SVD selects only the dominantly failed test vectors for each failed die and uses them for diagnostic simulation. This approach helps in identifying the so-called "hot spots" of the design while discarding statistically insignificant fault patterns from further analysis. Hot spots refer to the areas on the failed die where one or more repetitive (or systematic) failures are observed.

SVD reduces runtime for analysis but does not necessarily guarantee high quality of results (QoR), because only dominantly failed test vectors are selected for diagnostic simulation. This approach is based on the generalization that systematic defects occur over a large number of samples and resultantly affect a large number of test vectors. However, some systematic defects may not always affect the majority of failed test vectors or may affect different parts (or hot spots) of a design on different chips. As a result, different sets of test vectors may fail for different chips. If different sets of test vectors fail for different chips of the same device caused by the same systematic defect, it is highly probable that the above SVD schemes would not correctly diagnose the systematic defect.

SVD finds systematic defects of failed dies but has several issues. SVD diagnoses only the most statistically dominant hot spots based on diagnostic scores. Diagnostic scores measure how well the behavior of the modeled defects matches the results measured on a specific failed die. The matching behavior is contained within the patterns that are selected. SVD generates a low diagnostic score for a hot spot in some cases. For instance, a systematic defect affecting 10 locations on a design may appear in different combinations on the IC. Only the patterns impacted by the dominant systematic defect are selected since their diagnostic scores are high, but the patterns that are not impacted by the dominant systematic defect are not selected due to their low scores. In order to locate all the hot spots in the failed dies, it is required to run a CPU-intensive diagnostic simulation. Undesirably, failed dies with random defects as well as the ones with systematic defects may also be included in the analysis, causing unnecessary CPU usage. Failure patterns for random defects are also collected in the database and Pareto analysis is performed thereon, thereby further slowing down the speed of the analysis.

In order to resolve these issues raised with SVD, much research has been conducted by semiconductor and yield management companies. Their research has been focused on the improvement of analysis speed by creating a database for failure modes and efficiently diagnosing failure patterns in comparison with the failure modes on the database to produce faster yet reliable results.

Several approaches have been made to overcome the issues with SYD. Schuermyer et al. ("Identification of Systematic Yield Limiters in Complex ASICs through Volume Structural Fail Data Visualization and Analysis", Proc IEEE International Test Conference, pp. 137-145, November 2005) proposed a solution to identify yield weaknesses. According to Schuermyer et al., failed test data are transformed from the tester into fail signatures. For a large population of failures, the number of each unique fail signature is counted. Based on key process parameters, the population of failed dies is split into two subgroups, and the relative counts of fail signatures for each group are compared.

Huisman et al. ("Data Mining Integrated Circuits with Fails Commonalities", Proceedings of the International Test Conference, Oct. 2004, pp. 661-668) described a way to use failed test data from many ICs to determine which ICs failed by similar causes rather than determining the cause of individual failed ICs. They adopted a clustering technique to select the failed ICs caused by similar defects. Bernstein ("Yield Enhancement from Bitmap Analysis", KLA-Tencor, Company Magazine, pp. 22-24, autumn 1998) proposed an analysis method to understand failures occurring on many different ICs.

The proposed solutions by the above references are pre-diagnostic techniques where the grouping or clustering of ICs is done prior to the analysis to identify systematic defects and to de-emphasize random defects. Grouping or clustering is done on the basis of similar failures with respect to test vectors, scan-flops or primary outputs (POs) that failed on a particular die. Clustering approaches resolve some issues with SVD mentioned earlier. However, SVD by clustering still runs only on failed dies with systematic defects, so failed dies with random defects are not diagnosed. Failure patterns are collected on the database and Pareto analysis is performed on the 'intelligently' selected failures, thus the results are obtained relatively faster.

Despite some improvements made over the conventional SVD, there remain issues unresolved by clustering approaches. Clustering approaches fail to detect all the hot spots because hot spots with high diagnostic scores are selected and analyzed. Clustering approaches diagnose only the most dominant hot spots and diagnostics scores may be low even for hot spots. CPU-intensive diagnostics simulation is required to locate all the hot spots, and the database collection and Pareto analysis are also performed on all the defects including the ones with low scores, thereby slowing down the analysis and sometimes causing misleading results.

In addition, there exist architectural issues associated with the clustering approaches. Clustering of the failing dies based on fail signatures is very inefficient because there may be multiple hot spots in the design, and failures can occur in different combinations. In such cases, no matching can be detected across the failing dies. The assumption that random defects occur independently on a small set of failing dies is incorrect because random defects can occur along with other systematic defects. If random defects occur in combination with systematic defects, the matching algorithms proposed by the clustering approaches fail to correctly diagnose such defects. Diagnostics scores may be poor in cases where a failed die has multiple hot spots in it because the diagnostics tools tend to match all the failures identified with the single stuck-at fault simulated. These failures have to be individually diagnosed using more sophisticated algorithms to find the individual hot spots.

SUMMARY

A method and system for selecting test vectors in statistical volume diagnosis (SVD) using failed test data is disclosed. A computer-implemented method receives failures representing defects detected by an integrated circuit testing apparatus from a plurality of integrated circuits. Each of the plurality of integrated circuits is tested with a set of test vectors generated by the integrated circuit testing apparatus, and each of the plurality of failures is associated with a failed test vector. Using a first ranking scheme, each of the failures is given a rank and the corresponding failed test vector in each of the plurality of integrated circuits is annotated with the rank. The annotated failed test vectors are grouped using a grouping scheme, and each of the groups is given a group rank. A first group of failed test vectors is selected based on the group rank and diagnostics is run on the first group of tailed test vectors.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiment of the present invention and together with the general description given above and the detailed description of the preferred embodiment given below serve to explain and teach the principles of the present invention.

Figure 1:
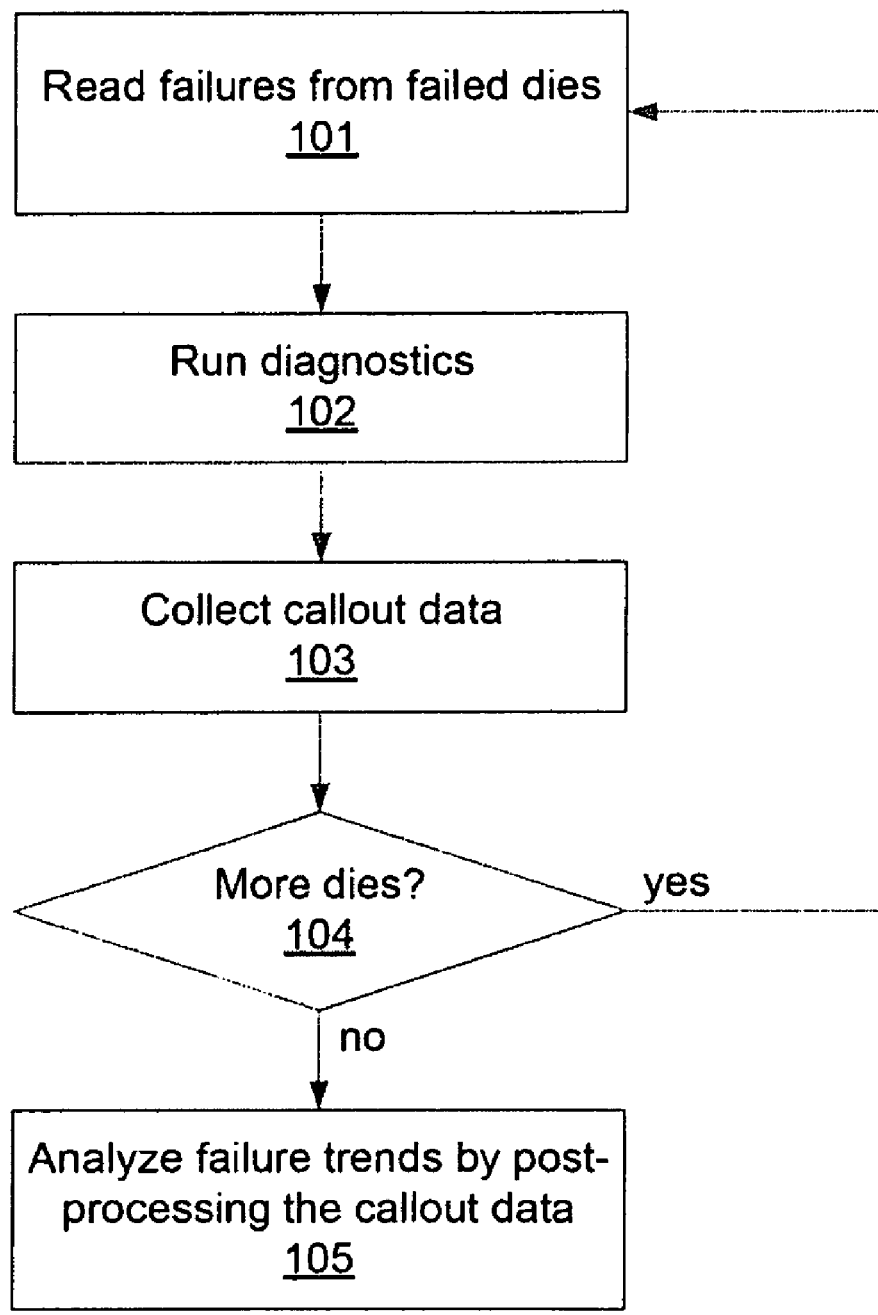
FIG. 1 illustrates a prior art process for volume yield diagnostics (VYD), according to one embodiment of the present invention.

It should be noted that the figures are not necessarily drawn to scale and that elements of similar structures or functions are generally represented by like reference numerals for illustrative purposes throughout the figures. It also should be noted that the figures are only intended to facilitate the description of the various embodiments described herein. The figures do not describe every aspect of the teachings disclosed herein and do not limit the scope of the claims.

DETAILED DESCRIPTION

A method and system for selecting test vectors in statistical volume diagnosis (SVD) using failed test data is disclosed. Each of the features and teachings disclosed herein can be utilized separately or in conjunction with other features and teachings to provide a method for reducing the order of system models exploiting sparsity. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present invention. However, it will be apparent to one skilled in the art that these specific details are not required to practice the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the teachings of the invention as described herein.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

A method and system for selecting test vectors in statistical volume diagnosis (SVD) using failed test data is disclosed. A computer-implemented method receives failures representing defects detected by an integrated circuit tester from a plurality of integrated circuits. Each of the plurality of integrated circuits is tested with a set of test vectors generated by the integrated circuit tester, and each of the plurality of failures is associated with a failed test vector. Using a first ranking scheme, each of the failures is given a rank and the corresponding failed test vector in each of the plurality of integrated circuits is annotated with the rank. The annotated failed test vectors are grouped using a grouping scheme, and each of the groups is given a group rank. A first group of failed test vectors is selected based on the group rank and diagnostics is run on the first group of tailed test vectors.

The above and other preferred features described herein, including various novel details of implementation and combination of elements, will now be more particularly described with reference to the accompanying drawings and pointed out in the claims. It will be understood that the particular methods and circuits are shown by way of illustration only and not as limitations of the claims. As will be understood by those skilled in the art, the principles and features of the teachings herein may be employed in various and numerous embodiments without departing from the scope of the claims.

FIG. 1 illustrates a prior art process for volume yield diagnostics (VYD), according to one embodiment. A set of test vectors is generated by an ATPG program and applied to a device (chip or die) for testing the defectiveness thereof. The device under test receives test inputs at its input pin(s) and creates test outputs to its output pin(s). Failure is detected when a test vector applied to the device under test yields an output that is different from the expected output corresponding to the applied test vector. If the device has multiple outputs, multiple failure measures can be detected for a given test vector.

According to one embodiment, the present method for selecting test vectors is performed on a computer having a diagnostic engine. The diagnostic engine runs a diagnostic software on various computer platforms such as Sun Solaris, HP-UX, Linux, or IBM AIX, which can comprise a processor, an associated chipset and random access memory, as well as other components used in computer systems. In an alternative embodiment, the diagnostic engine may comprise a dedicated hardware including a digital signal processor (DSP) and random access memory with associated peripherals. The diagnostic engine may be equipped with a graphics card, keyboard, and/or a mouse to provide user interface to and receive feedback from a user. A list of failure measures are received and stored in a buffer of the computer, and various software algorithms are applied to the list of failure measures and the associated test vectors, and a set of test vectors are selected for VYD. According to one embodiment, the diagnostic engine runs trend/Pareto analysis to identify yield limiters and locate the root cause of failures.

Failure measures are read from a failed die (101) and stored in a buffer of a diagnostic tool. Diagnostics is run on the stored failed measures (102). A callout data is created from the result of the diagnostics (103). After the diagnostics/callout data collection process repeats for all the sampled failed dies (101-104), the collected callout data are analyzed to identify failure trends of the failed dies (105).

VYD is useful in predicting systematic defects that affect yield loss. Systematic defects that are repetitive in nature over a statistically large sample of dies are referred to as "process-related defects." Systematic defects can also occur at a location in a chip or at multiple locations on different chips. Systematic defects that occur at locations across all the sampled dies and repeat over a statistically large sample are referred to as "feature-related defects."

Defects that are detected by the tester are written to an ASCII file along with failure information. According to one embodiment, the detected defects are marked with pattern number, scan flop/PO name and unload cycle number, for example, 'pattern 10, output SCANOUT[10] unload cycle 30'.

A list of failed dies is imported and diagnosed with a diagnostic simulation tool. The results of the diagnostic simulation, often referred to as "callout data," include a list of failed nets with fault type and the score of the location. Table 1 shows exemplary callout data.

TABLE 1 exemplary callout data

| Net | Fault | Score |
|---|---|---|
| Top.in.A | SA0 | 95 |
| Top.in2.B | SA1 | 90 |

For example, fault type SA0, i.e., stuck at zero, is fixed to the ground voltage and fault type SA1, i.e., stuck at one, is fixed to the high signal voltage. The diagnostic simulation continues until all the failed dies are diagnosed. According to one embodiment, callout data is stored in a database incrementally after simulating each failed die. Once the whole failed dies are diagnosed, the accumulated callout data is analyzed by Pareto analysis to find failure trends in the defective nets. In general, the nets that significantly show in the Pareto analysis cause yield loss. The failure modes predicted by the analysis are assumed to be systematic defects (e.g., process-related and/or feature-related defects).

Figure 2:
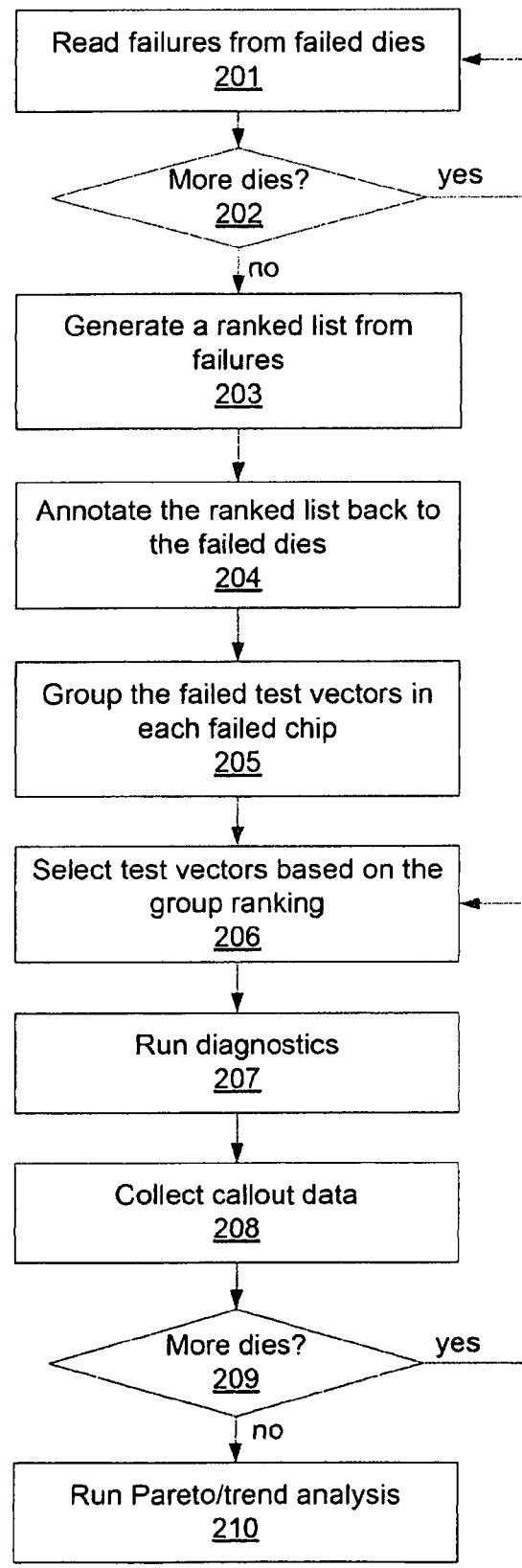
FIG. 2 shows a flow chart of an exemplary test vector selection process, according to one embodiment.

FIG. 2 shows a flow chart of an exemplary test vector selection process, according to one embodiment. Failure measures are read from a failed die (201) and stored in a buffer of a diagnostic tool. This process repeats for all the failed chips (201-202). Each failure measure contains failure information such as pattern numbers and scan flops/POs. Properties of the failure measures are used to generate a ranked list for the collected failure measures (203). The ranked list is later used for an input for diagnostics tools to identify the location of failed dies.

According to one embodiment, failure measures are prioritized using various ranking techniques. The order in which the failure measures appear in the ranked list represents the dominance of systematic defects. The failure measures at the top of the ranked list are strongly correlated with systematic faults that occurred most frequently on the failed chips.

Failure measures are ranked using various ranking criteria. For example, the number of times a particular test pattern failed over a particular scan-flop/PO on the chips, the number of times a particular test vector failed on the chips, or the number of times a particular scan-flop/PO failed on the chips is used for ranking. Alternatively, the number of times a defect appears in the back-cone of failed test data may be used for ranking. A back-cone refers to a set of logic which feeds the net containing the defects. The probability obtained from a hot spot correlation tool may also be used for ranking. According to one embodiment, a ranked list is formed using one of these ranking criteria. According to another embodiment, a weighted combination of multiple ranking criteria is used to rank the failure measures.

The ranked failure measures are then annotated back to each of the failed dies (204). According to one embodiment, when a failed die contains more than one failure measures, the failed die is ranked based on the highest rank of the failure measures. The failed dies are then reordered with their ranks to emphasize the most dominant failure measure while the failure measures with lower ranks are deemphasized. According to another embodiment, the failed die is ranked based on the average rank of the failure measures. Different ranking schemes for failed dies may be used to achieve different results.

Depending on its rank in the list, a particular die is selected for further analysis. If the highest rank of a particular failed die scores is lower in the list, the particular failed die is not chosen for further analysis. According to one embodiment, a threshold is set for the selection of failed dies for analysis. The choice of the threshold may vary depending on the ranking scheme, the numbers of failed test data, or any other factors that the analysis aims for. This way, the failed dies affected by random defects are filtered out and excluded from further analysis to save time for analysis.

When multiple failed test vectors are detected for a failed die, the failed test vectors are grouped together using a clustering algorithm (205). According to one embodiment, the grouping is done such that all the test vectors in a particular group corresponds to the specific behavior of a systematic defect on a particular part of the local design. By grouping or clustering, test vectors with the closest ranks are grouped into separate bins. The group of test vectors at the top of the list for a particular die represents the test vectors that failed by the dominant systematic defects, which critically occurred over a large number of chips compared to the other defects appearing on the same die. Hence, grouping of test vectors provides means for filtering systematic defects that affect yield loss in an efficient manner.

The dominance that a defect exhibits is decided by its ranking scheme. When a ranked list is formed, for example, by the number of times a particular pattern failed over all the chips or the number of times a particular scan-flop/PO failed, the group of test vectors that ranked higher in the list represents dominant systematic defects. On the other hand, the group of test vectors ranked lower in the list represents defects that occur less frequently. In general, the group of test vectors that is at the bottom of the ranked list represents random defects that occur least frequently across the chips.

Grouping of test vectors on the basis of their ranking provides means for filtering systematic defects, but does not warrant an accurate filtering. There may be test vectors pointing to different defects even if they have the same ranking. According to one embodiment, subsequent subgrouping using a different grouping criterion provides higher probability of filtering systematic defects as desired.

The groups at the top of the ranked list are further diagnosed. For example, test vectors that belong to the top-ranked groups of each failed dies are selected (206), and diagnostics is run for each failed die (207). Callout data from the result of the diagnostics for each failed die are collected (208) until all the failed dies are diagnosed (209). The callout data for the selected groups are used to run Pareto/trend analysis (210).

According to one embodiment, the test vectors at the top of each group are diagnosed individually or collectively for any particular failed die. The test vectors at the top of each subgroup are diagnosed when the test vectors for a particular group are selected for subgrouping. Hence, the ranked list approach along with the grouping of the test vectors helps not only detecting multiple systematic defects that occur across the dies, but also providing information about which systematic defects are dominant.

Figure 3:
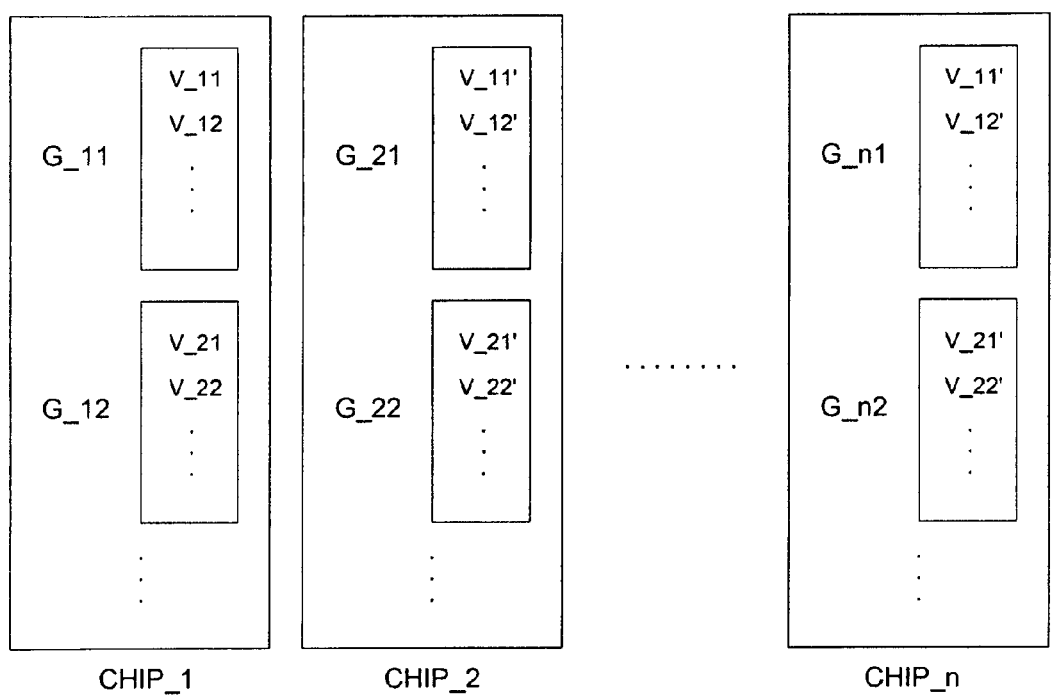
FIG. 3 illustrates an exemplary block diagram showing ranked and grouped test vectors, according to one embodiment.

FIG. 3 illustrates an exemplary block diagram showing ranked and grouped test vectors, according to one embodiment. N failed chips 'CHIP_x' (where x=1, 2 ... n) are sampled for analysis. It is appreciated that "chips" and "dies" are exchangeably used in the present application without causing confusion. The rectangles 'G_xy' (where x is the chip number and y is the group number) are groups of test vectors formed in each chip containing one or more failed test vectors 'V_xy' (where x is the group number and y is the rank of the test vector). For example. 'V_11' and 'V_12' in 'CHIP_1' are the test vectors in group 'G_11' that represents the group containing the highest ranked test vectors out of all failed test vectors in 'CHIP_1'. The group 'G_11' is ranked highest in 'CHIP_1' because it contains test vectors 'V_11' and 'V_12' that have critically failed over a large number of chips by dominant systematic defects. It is noted that the same test vector may appear in different groups for different chips because different chips may have different dominant systematic defects. Furthermore, the same group of test vectors may have a reasonably low rank in other chips because such test vectors are less dominant compared to other test vectors caused by more dominant systematic defects.

The present method and system for selecting test vectors introduces a concept called 'group dominance'. A group of test vectors 'G_i' in the ranked list of any particular failed chip is dominant over a group 'G_j' if all the test vectors in 'G_i' have a higher rank than any of the test vectors in 'G_j'. In FIG. 3, 'G_11' is the dominant group for CHIP_1, 'G_21' is a dominant group for CHIP_2 and so on. Over the number of sampled chips, only dominant test vectors are selected for analysis such that less dominant test vectors that might appear higher in rank for a particular chip but are significantly lower in rank for the majority of the sampled chips are not chosen. Once these dominant groups are selected, the set of test vectors in the dominant groups are led to the diagnostics tools, and an efficient callout data is built therefrom.

Figure 4:
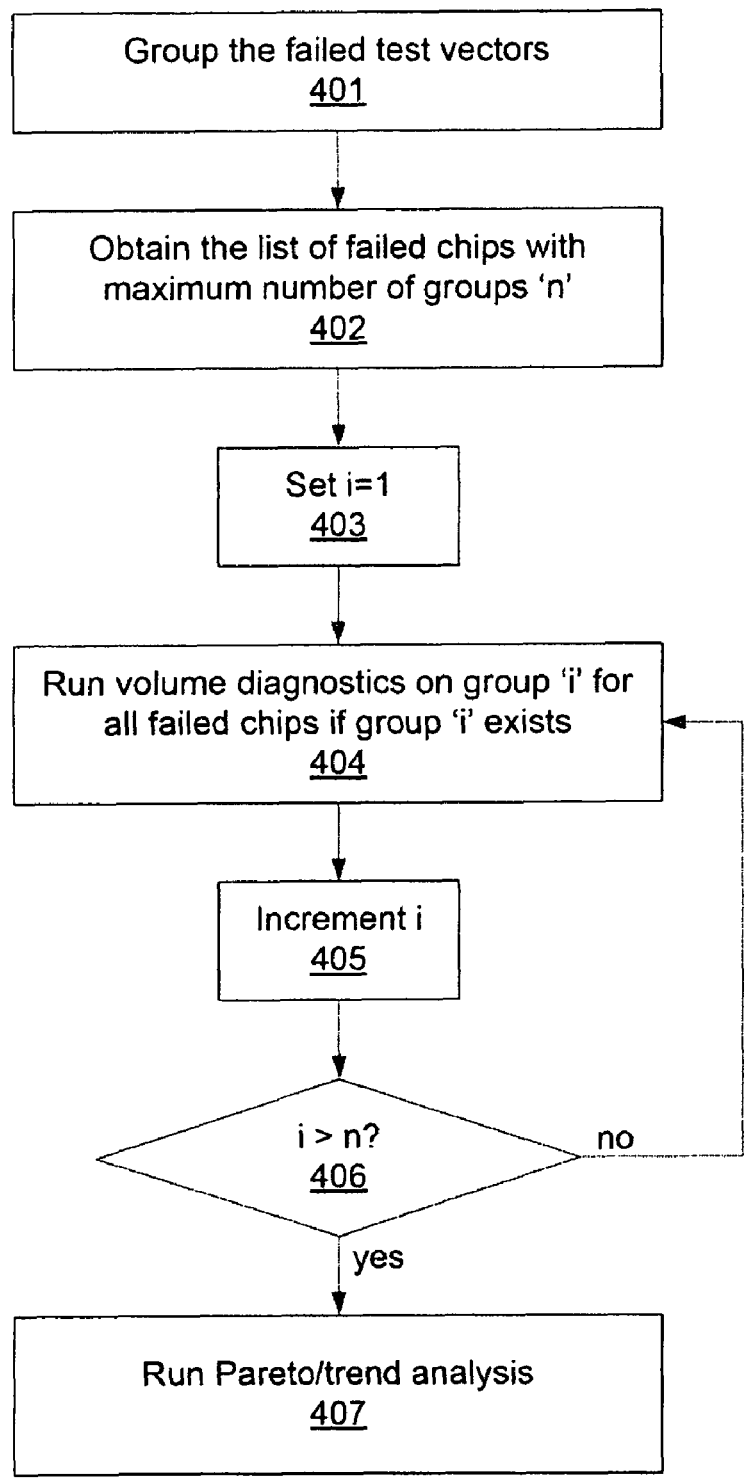
FIG. 4 illustrates an exemplary multi-pass VYD method, according to one embodiment.

FIG. 4 illustrates an exemplary multi-pass VYD method, according to one embodiment. Failed test vectors are grouped using a grouping scheme (401) as illustrated in FIG. 3. Only the failed chips that has more than a predetermined number of groups, for example 'n', are selected (402) and volume diagnostics is run on the selected group (404). The number 'n' varies with ranking and grouping schemes. Volume diagnostics is run until all the selected group of the failed chips are diagnosed (404-406). The results of the collective volume diagnostics are used to run Pareto/trend analysis (407).

According to one embodiment, the exemplary multi-pass VYD method of FIG. 4 selects the top group in each selected failed chip and runs a first pass of the diagnostics. The group diagnosed in all the selected failed chips is considered to include a systematic defect. A second pass of the diagnostics is run on the second top group of each selected failed chip. This process continues until all the groups are diagnosed. This multi-pass VYD method is advantageous over a single-pass VYD method. The groups diagnosed in a pass represents a systematic defect, and the defects in the failed chips are automatically partitioned by running diagnostics in multiple passes. User is given an option to choose the CPU resources prior to running diagnostics by inspecting the amount of time it would take for completing all the passes.

VYD by grouping test vectors based on their ranks has several advantages over conventional VYD. Systematic defects are identified quickly, and the combinations of defects that occur across failed chips are also diagnosed. The grouping technique is particularly efficient in detecting and diagnosing hot spots. The diagnostic scores for hot spots are high because they are hardly missed by the grouping and selection process. The CPU time is focused more on the detection of hot spots rather than on the diagnosis of random defects. In cases where defects occur only in group, the grouping technique helps to predict the groups and their individual locations.

The grouping technique efficiently filters random defects because random defects statistically occur at a low rate. Therefore, the groups containing random defects have lower ranks when compared to the groups containing systematic defects, thus are excluded from analysis. For example, when the threshold value is set to 80%, any group whose rank is less than 80% of the highest rank is excluded from analysis. The threshold value for group selection may vary depending on other factors such as the available resources, the restriction on analysis time, and the accuracy requirement for the analysis.

Figure 5:
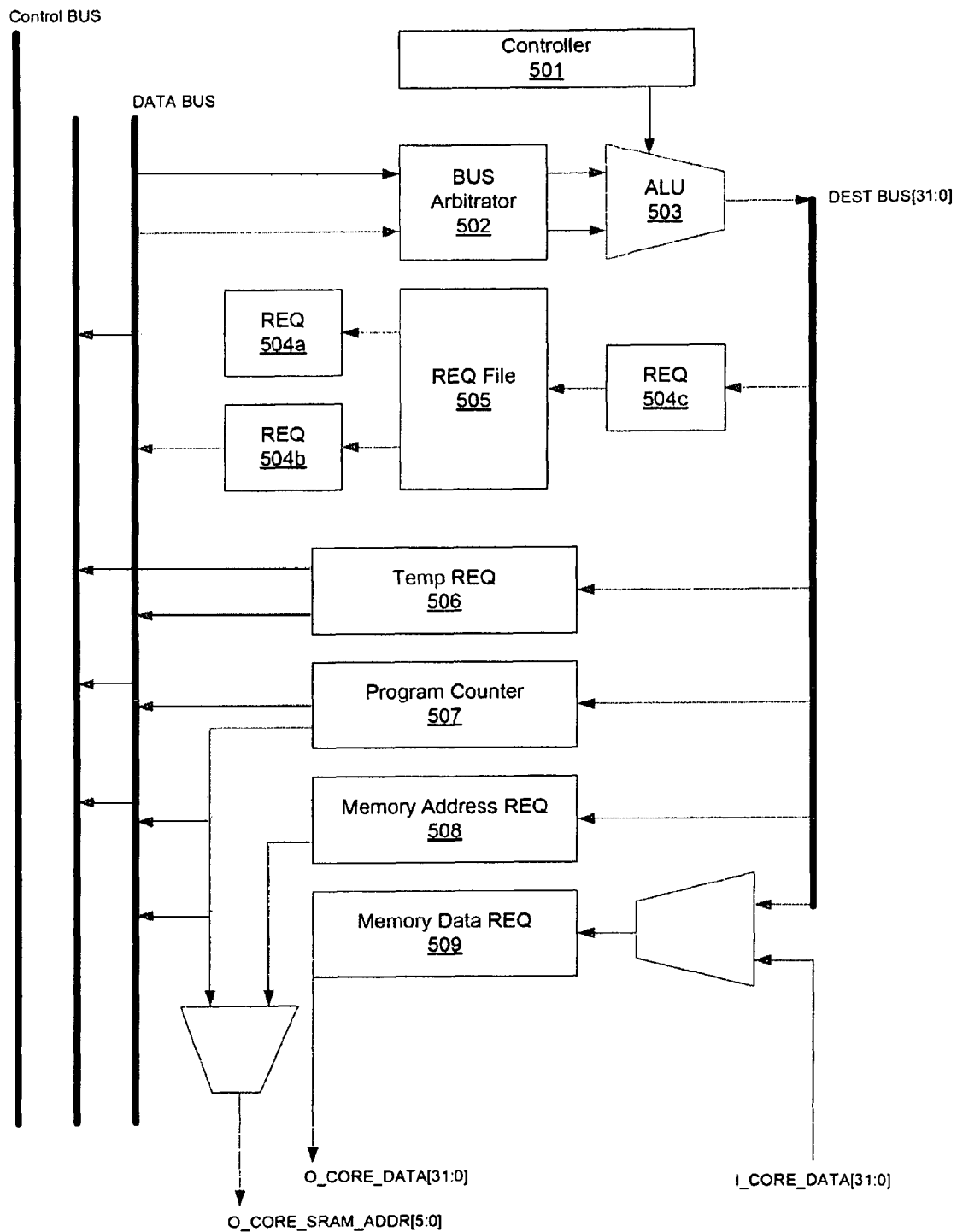
FIG. 5 illustrates an exemplary design of a DLX processor on which an experiment is performed, according to one embodiment.

FIG. 5 illustrates an exemplary design of a DLX processor on which an experiment is performed, according to one embodiment. The experiment is designed to demonstrate the efficiency of grouping test vectors. Five stuck-at-faults of different kinds are manually inserted at different logical parts of the design (nets) as shown in Table 2.

TABLE 2

Faults inserted in an exemplary DLX processor design

| Fault | Net number | Net name | Type of fault |
|---|---|---|---|
| a | 39960 | THE__ALU.i__1345.outB | Stuck-at-1 |
| b | 40901 | THE__ALU.i__1447 | Stuck-at-1 |
| c | 170789 | THE__REG__FILE.i__18619519.Y | Stuck-at-0 |
| x | 173619 | THE__REG__FILE.i__329.Y | Stuck-at-1 |
| y | 156906 | THE__REG__FILE.i__114218142.outA | Stuck-at-1 |

Table 3 shows the different combinations of the five faults listed in Table 2 in a different number of virtual dies. Ten such different combinations are chosen and they are divided in a total of one hundred design files. 'x' and 'y' are random defects and 'a', 'b' and 'c' are the systematic defects that occur over a number of design files in a systematic fashion.

TABLE 3

Combinations of faults

| | Combination of Defects | Number of design files |
|---|---|---|
| 1 | a | 10 |
| 2 | a, b | 15 |
| 3 | b, c | 15 |
| 4 | c, a | 15 |
| 5 | a, b, c | 10 |
| 6 | b, x | 5 |
| 7 | c, y | 5 |
| 8 | b | 10 |
| 9 | c | 10 |
| 10 | x, y | 5 |

Test vectors are generated for the DLX processor design by automatic test pattern generation (ATPG). All these test vectors are then simulated in ten different scenarios as listed above, and a failure report for each scenario is created. Initially, the first five test vectors in the set of failed test vectors in each defective design file are diagnosed for simulation and the analysis results are shown in Table 4. High scores (H.S.) and diagnostic scores (D.S) for each fault pattern is shown.

TABLE 4

Test vectors selected for simulation

| | Scores | |
|---|---|---|
| Ranked List Criteria | High score (H.S.) | Diagnostic score of a particular fault (D.S.) |
| a | 100 | 100 |
| b, a | 54 | 45, 54 |
| b, c | 58 | 58, 41 |

TABLE 4-continued

Test vectors selected for simulation

| | Scores | |
|---|---|---|
| Ranked List Criteria | High score (H.S.) | Diagnostic score of a particular fault (D.S.) |
| c, a | 53 | 53, 46 |
| a, b, c | 36 | 36, 36, 26 |
| b, x | 81 | 81, 18 |
| c, y | 55 | 44, 55 |
| b | 100 | 100 |
| c | 100 | 100 |
| x, y | 83 | 16, 83 |

Diagnostic scores for fault patterns vary depending on the number and types of defects grouped together. For example, the score for fault pattern 'a' is 100 when detected alone but is 36 when grouped with fault patterns 'b' and 'c'. In cases when a systematic defect (a, b, c) and a random defect (x, y) are grouped together, the effect of the systematic defect is not filtered.

Chip/Pad/Pattern (CPP) files are used to extract information about failure measures to form a ranked list. CPP files contain the list of the failing measures obtained from the ATE and are used as inputs to the diagnostics tools. The failure measures are ranked, and the ranks for failure measures are back-annotated to the test vectors identified by the failure measures for each defected design file. Table 5 shows exemplary diagnostic scores of the fault patterns of Table 4 with three ranking schemes, pattern, pattern-flop and flop. The test vectors with the same or similar ranks are grouped together, and the group with the highest rank is first run for analysis. The groups with lower ranks are subsequently run for analysis until the analysis for all the groups within the threshold are completed.

TABLE 5

Exemplary diagnostic scores for various ranked list schemes

| Ranked list criteria | Pattern | | Pattern-Flop | | Flop | |
|---|---|---|---|---|---|---|
| | H.S. | D.S | H.S. | D.S. | H.S. | D.S. |
| a | 100 | 100 | 100 | 100 | 100 | 100 |
| b, a | 89 | 34, 87 | 97 | 97, 91 | 97 | 63, 0 |
| b, c | 91 | 87, 7 | 97 | 97, 0 | 100 | 0, 100 |
| c, a | 97 | 2, 94 | 97 | 0, 91 | 100 | 100, 0 |
| a, b, c | 88 | 86, 29, 2 | 97 | 91, 97, 0 | 100 | 0, 0, 100 |
| b, x | 97 | 93, 2 | 97 | 97, 0 | 100 | 66, 0 |
| c, y | 50 | 50, 50 | 100 | 100, 0 | 100 | 100, 0 |
| b | 100 | 100 | 100 | 100 | 100 | 100 |
| c | 100 | 100 | 100 | 100 | 100 | 100 |
| x, y | 83 | 16, 83 | 60 | 40, 60 | 83 | 16, 83 |

Failure patterns are ranked based on the number of times a particular parameter failed across all the failing chips. The ranking scheme using primary output (PO)/scan flip-flop (pseudo PO) is called flop scheme. The ranking scheme using test vectors is called pattern scheme. The ranking scheme using both PO/pseudo PO and test vector is called pattern-flop scheme. It is understood that other parameters may be used for ranking test vectors although only the three ranking schemes are used in the present example.

According to the exemplary trend analysis shown in Table 5, faults 'a' and 'b' are easily detected using 'pattern' and 'pattern-flop' schemes whereas fault 'c' is easily detected using the 'flop' scheme. However, when the grouping is not followed, all the multiple faults present on each failed die are not correctly identifiable for their severity of defect. Therefore, the grouping scheme (and/or followed by subgrouping) for the test vectors along with the ranked list ensures accurate diagnostic results even in the presence of multiple faults. The exemplary analysis shows that the 'pattern-flop' scheme yields the best result out of the three schemes. The 'pattern-flop' scheme yields a higher diagnostic score, which implies better results.

Different faults have different effects on failed test vectors and flops. Some faults affect the number of failing patterns per chip whereas others target the failed flops per chip. Therefore, different schemes might serve different purposes in different conditions and situations. Grouping supplemented with subgrouping might yield good results in reasonably complex situations. According to one embodiment, different grouping schemes are used for grouping and subgrouping to yield the best result. When the design contains other complex faults (e.g., delay fault), simulations with varying ranking and/or grouping schemes are run and the scheme that produces the most realistic results is used for analyzing systems having such type of faults.

According to one embodiment, a weighted combination of all the three schemes mentioned earlier may work well in some situations. In some cases, a single ranking scheme might work better for predicting dominant faults for some chips. The ranking scheme used for a diagnostic simulation may find different dominant failures on the failed chips. For example, the 'pattern' scheme finds most dominant faulty patterns whereas the 'pattern-flop' scheme finds most dominant faulty flops.

A method and system for selecting test vectors in SVD using failed test data is disclosed. Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A computer-implemented method, comprising:
    receiving failures representing defects detected by an integrated circuit testing apparatus from a plurality of integrated circuits, wherein each of the plurality of integrated circuits is tested with a set of test vectors generated by the integrated circuit testing apparatus and each of said failures is associated with a failed test vector;
    generating ranks for each of said failures using a first ranking scheme;
    annotating said ranks to the failed test vector for each of said failures in each of the plurality of integrated circuits;
    generating a plurality of groups by grouping the failed test vectors in each of the plurality of integrated circuits using a grouping scheme;
    assigning a group rank to each of the plurality of groups using a second ranking scheme;
    selecting a first group of failed test vectors from the plurality of groups in each of the plurality of integrated circuits using a selection criterion; and
    running diagnostics on the first group of failed test vectors.

2. The computer-implemented method of claim 1, wherein the first ranking scheme is one of a pattern scheme, a pattern-flop scheme and a flop scheme.

3. The computer-implemented method of claim 1, wherein each of the plurality of groups is further grouped into one or more subgroups using a second grouping scheme.

4. The computer-implemented method of claim 3, wherein the second grouping scheme is different from said grouping scheme.

5. The computer-implemented method of claim 3, wherein the first group of failed test vectors includes the failed test vectors at the top of the one or more subgroups.

6. The computer-implemented method of claim 1, wherein the first group of failed test vectors includes the group of the plurality of groups with the highest group rank.

7. The computer-implemented method of claim 1, wherein the selection criterion uses the group ranks and a threshold value to select the first group of failed test vectors.

8. The computer-implemented method of claim 1, further comprising:
   generating callout data after running diagnostics on the first group of failed test vectors; and
   running trend analysis based on the callout data.

9. The computer-implemented method of claim 8, wherein the selection criterion employs a multi-pass selection process comprising:
   selecting integrated circuits that have more than a predetermined number of groups; and
   selecting the first group of failed test vectors only from the failed test vectors in the selected integrated circuits.

10. The computer-implemented method of claim 9, further comprising
    running diagnostics on the first group of failed test vectors; and
    determining that the failed test vector represents a systematic defect if the failed test vector is diagnosed in at least one group in each of all the selected integrated circuits.

11. A computer-readable non transitory storage medium having stored thereon a plurality of instructions, said plurality of instructions when executed by a computer, cause said computer to perform:
    receiving failures representing defects detected by an integrated circuit testing apparatus from a plurality of integrated circuits, wherein each of the plurality of integrated circuits is tested with a set of test vectors generated by the integrated circuit testing apparatus and each of said failures is associated with a failed test vector;
    generating ranks for each of said failures using a first ranking scheme;
    annotating said ranks to the failed test vector for each of said failures in each of the plurality of integrated circuits;
    generating a plurality of groups by grouping the failed test vectors in each of the plurality of integrated circuits using a grouping scheme;
    assigning a group rank to each of the plurality of groups using a second ranking scheme;
    selecting a first group of failed test vectors from the plurality of groups in each of the plurality of integrated circuits using a selection criterion; and
    running diagnostics on the first group of failed test vectors.

12. The computer-readable non transitory storage medium of claim 11, wherein the first ranking scheme is one of a pattern scheme, a pattern-flop scheme and a flop scheme.

13. The computer-readable non transitory storage medium of claim 11, wherein each of the plurality of groups is further grouped into one or more subgroups using a second grouping scheme.

14. The computer-readable non transitory storage medium of claim 13, wherein the second grouping scheme is different from said grouping scheme.

15. The computer-readable non transitory storage medium of claim 13, wherein the first group of failed test vectors includes the failed test vectors at the top of the one or more subgroups.

16. The computer-readable non transitory storage medium of claim 11, wherein the first group of failed test vectors includes the group of the plurality of groups with the highest group rank.

17. The computer-readable non transitory storage medium of claim 11, wherein the selection criterion uses the group ranks and a threshold value to select the first group of failed test vectors.

18. The computer-readable non transitory storage medium of claim 11 having stored thereon a plurality of instructions, said plurality of instructions when executed by a computer, cause said computer to further perform:
    generating callout data after running diagnostics on the first group of failed test vectors; and
    running trend analysis based on the callout data.

19. The computer-readable non transitory storage medium of claim 18, wherein the selection criterion employs a multi-pass selection process comprising:
    selecting integrated circuits that have more than a predetermined number of groups; and
    selecting the first group of failed test vectors only from the failed test vectors in the selected integrated circuits.

20. The computer-readable non transitory storage medium of claim 19 having stored thereon a plurality of instructions, said plurality of instructions when executed by a computer, cause said computer to further perform:
    running diagnostics on the first group of failed test vectors; and
    determining that the failed test vector represents a systematic defect if failed test vector is diagnosed in at least one group in each of all the selected integrated circuits.

21. A diagnostic system for identifying yield limiters using a group of failed test vectors, comprising:
    a buffer that stores failures representing defects detected by an integrated circuit testing apparatus from a plurality of integrated circuits, wherein each of the plurality of integrated circuits is tested with a set of test vectors generated by the integrated circuit testing apparatus and each of said failures is associated with a failed test vector;
    a diagnostic engine comprising a processor and random access memory for running diagnostics on the group of failed test vectors selected from a plurality of groups in each of said plurality of integrated circuits using a selection criteria, wherein said plurality of groups are generated by:
    generating ranks to each of said failures using a first ranking scheme;
    annotating said ranks to the failed test vectors for each of said failures in each of the plurality of integrated circuits;
    grouping the failed test vectors in each of said plurality of integrated circuits using a grouping scheme; and;
    assigning a group rank to each of the plurality of groups using a second ranking scheme.

22. The diagnostic system of claim 21, wherein the first ranking scheme is one of a pattern scheme, a pattern-flop scheme and a flop scheme.

23. The diagnostic system of claim 21, wherein each of the plurality of groups is further grouped into one or more subgroups using a second grouping scheme.

24. The diagnostic system of claim 23, wherein the second grouping scheme is different from said grouping scheme.

25. The diagnostic system of claim 23, wherein the first group of failed test vectors includes the failed test vectors at the top of the one or more subgroups.

26. The diagnostic system of claim 21, wherein the first group of failed test vectors includes the group of the plurality of groups with the highest group rank.

27. The diagnostic system of claim 21, wherein the selection criterion uses the group ranks and a threshold value to select the first group of failed test vectors.

28. The diagnostic system of claim 21, wherein trend analysis is run based on callout data generated after running diagnostics on the first group of, failed test vectors.

29. The diagnostic system of claim 28, wherein the selection criterion employs a multi-pass selection process comprising:
   selecting integrated circuits that have more than a predetermined number of groups; and
   selecting the first group of failed test vectors only from the failed test vectors in the selected integrated circuits.

30. The diagnostic system of claim 29, wherein a systematic defect is found if the failed test vector is diagnosed in at least one group in each of all the selected integrated circuits.

* * * * *